(12) United States Patent
Kaneko et al.

(10) Patent No.: US 10,848,122 B2
(45) Date of Patent: Nov. 24, 2020

(54) FILTER AND MULTIPLEXER

(71) Applicant: TAIYO YUDEN CO., LTD., Tokyo (JP)

(72) Inventors: Takuya Kaneko, Tokyo (JP); Naoki Takahashi, Tokyo (JP)

(73) Assignee: TAIYO YUDEN CO., LTD., Tokyo (JP)

( * ) Notice: Subject to any disclaimer, the term of this patent is extended or adjusted under 35 U.S.C. 154(b) by 0 days.

(21) Appl. No.: 15/784,477

(22) Filed: Oct. 16, 2017

(65) Prior Publication Data

US 2018/0115300 A1 Apr. 26, 2018

(30) Foreign Application Priority Data

Oct. 21, 2016 (JP) ................................. 2016-206852

(51) Int. Cl.
*H03H 9/02* (2006.01)
*H03H 9/64* (2006.01)
*H03H 9/25* (2006.01)

(52) U.S. Cl.
CPC .... *H03H 9/02834* (2013.01); *H03H 9/02559* (2013.01); *H03H 9/25* (2013.01); *H03H 9/6483* (2013.01)

(58) Field of Classification Search
CPC .. H03H 9/02834; H03H 9/02559; H03H 9/24; H03H 9/6483
See application file for complete search history.

(56) References Cited

U.S. PATENT DOCUMENTS

| 2004/0100342 A1 | 5/2004 | Nishihara et al. |
| 2007/0030096 A1 | 2/2007 | Nishihara et al. |

(Continued)

FOREIGN PATENT DOCUMENTS

| JP | 2004-173191 A | 6/2004 |
| JP | 2007-74698 A | 3/2007 |

(Continued)

OTHER PUBLICATIONS

Japanese Office Action dated Mar. 12, 2019, in a counterpart Japanese patent application No. 2016-206852. (A machine translation (not reviewed for accuracy) attached.).

*Primary Examiner* — Samuel S Outten
(74) *Attorney, Agent, or Firm* — Chen Yoshimura LLP (57) ABSTRACT

A filter includes: parallel resonators connected in parallel between input and output terminals; series resonators connected in series between the input and output terminals; nodes at which the parallel resonators connect to a series pathway between the input and output terminals; first and second resonators included in the series resonators and connected in series in a first section of sections each being the series pathway between adjacent nodes of the nodes, the input terminal, and the output terminal, a difference in antiresonant frequency between the first and second resonators being a first difference; and third and fourth resonators included in the series resonators and connected in series in a second section of the sections, a difference in antiresonant frequency between the third and fourth resonators being a second difference, a third difference in antiresonant frequency between the first and third resonators being less than the first and second differences.

12 Claims, 11 Drawing Sheets

(56) References Cited

U.S. PATENT DOCUMENTS

2012/0182088 A1* 7/2012 Inoue .................... H03H 9/725
    333/133
2013/0113576 A1* 5/2013 Inoue .................. H03H 9/6433
    333/133

FOREIGN PATENT DOCUMENTS

| JP | 2012-151697 A | 8/2012 |
| JP | 2013-118611 A | 6/2013 |

* cited by examiner

SECOND COMPARATIVE EXAMPLE

| SERIES RESONATOR | S11 | S12 | S21 | S22 | S3 | S4 |
|---|---|---|---|---|---|---|
| ANTIRESONANT FREQUENCY | A1 | A1 | A2 | A2 | B | C |

THIRD COMPARATIVE EXAMPLE

| SERIES RESONATOR | S11 | S12 | S21 | S22 | S31 | S32 | S4 |
|---|---|---|---|---|---|---|---|
| ANTIRESONANT FREQUENCY | A1 | A1 | A2 | A2 | A3 | A3 | C |

FIRST EMBODIMENT

| SERIES RESONATOR | S11 | S12 | S21 | S22 | S3 | S4 |
|---|---|---|---|---|---|---|
| ANTIRESONANT FREQUENCY | A1 | D | A2 | E | B | C |

FIG. 6C

SECOND EMBODIMENT

| SERIES RESONATOR | S11 | S12 | S21 | S22 | S3 | S4 |
|---|---|---|---|---|---|---|
| ANTIRESONANT FREQUENCY | A1 | D | A2 | E | A3 | C |

THIRD EMBODIMENT

|  | NUMBER OF PAIRS | APERTURE LENGTH | PITCH [μm] |
|---|---|---|---|
| S11 | 76 | 24.99λ | 4.243 |
| S12 | 76 | 24.99λ | 4.184 |
| S21 | 69 | 24.99λ | 4.245 |
| S22 | 70 | 16.96λ | 4.213 |
| S3 | 64 | 22.43λ | 4.248 |
| S4 | 61 | 22.39λ | 4.226 |
| P1 | 69.5 | 39.83λ | 4.425 |
| P2 | 44.5 | 37.04λ | 4.468 |
| P3 | 70 | 39.99λ | 4.435 |
| C1, C2 | 20.5 | 8.89λ | 3.882 |

FIG. 9B

FOURTH COMPARATIVE EXAMPLE

|  | NUMBER OF PAIRS | APERTURE LENGTH | PITCH [μm] |
|---|---|---|---|
| S11 | 76 | 24.99λ | 4.242 |
| S12 | | | |
| S21 | 65 | 24.99λ | 4.235 |
| S22 | | | |
| S3 | 64 | 22.43λ | 4.249 |
| S4 | 61 | 22.39λ | 4.216 |
| P1 | 69.5 | 35.56λ | 4.425 |
| P2 | 44.5 | 37.05λ | 4.468 |
| P3 | 70 | 39.99λ | 4.436 |
| C1, C2 | 20.5 | 8.89λ | 3.882 |

FILTER AND MULTIPLEXER

CROSS-REFERENCE TO RELATED APPLICATION

This application is based upon and claims the benefit of priority of the prior Japanese Patent Application No. 2016-206852, filed on Oct. 21, 2016, the entire contents of which are incorporated herein by reference.

FIELD

A certain aspect of the present invention relates to a filter and a multiplexer.

BACKGROUND

Ladder-type filters using acoustic wave resonators have been used in mobile communication terminals. It has been known that the power durability is improved by dividing a series resonator in the ladder-type filter as disclosed in, for example, Japanese Patent Application Publication No. 2007-74698.

However, when the series resonator is divided in multiple sections to improve the power durability while the attenuation characteristic in the attenuation range is maintained, the filter size increases because the number of sections increases.

SUMMARY OF THE INVENTION

According to a first aspect of the present invention, there is provided a filter including: a plurality of parallel resonators connected in parallel between an input terminal and an output terminal; a plurality of series resonators connected in series between the input terminal and the output terminal; a plurality of nodes at which the plurality of parallel resonators are coupled to a series pathway between the input terminal and the output terminal; a first resonator and a second resonator included in the plurality of series resonators and connected in series in a first section of a plurality of sections, a difference in antiresonant frequency between the first resonator and the second resonator being a first difference, each of the plurality of sections being the series pathway between adjacent nodes of the plurality of nodes, the series pathway between the input terminal and a node, of the plurality of nodes, adjacent to the input terminal, or the series pathway between the output terminal and a node, of the plurality of nodes, adjacent to the output terminal; and a third resonator and a fourth resonator included in the plurality of series resonators and connected in series in a second section of the plurality of sections, a difference in antiresonant frequency between the third resonator and the fourth resonator being a second difference, a third difference that is a difference in antiresonant frequency between the first resonator and the third resonator being less than the first difference and the second difference.

According to a second aspect of the present invention, there is provided a multiplexer including: the above filter.

According to a third aspect of the present invention, there is provided a multiplexer including: a first filter connected between a common terminal and a first terminal and being the above filter; and a second filter connected between the common terminal and a second terminal and having a passband higher than a passband of the first filter.

DETAILED DESCRIPTION

First Comparative Example

Figure 1A:
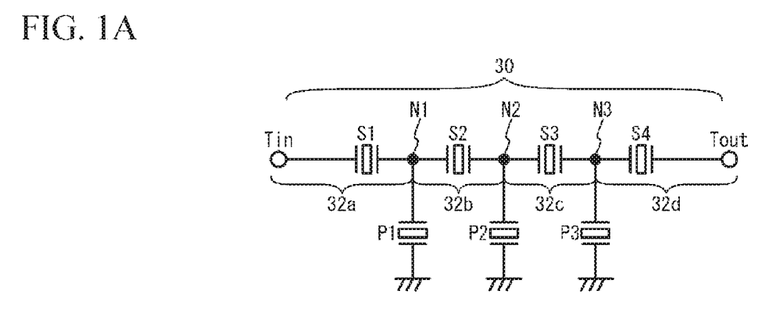
FIG. 1A is a circuit diagram of a ladder-type filter in accordance with a first comparative example.
Figure 1B:
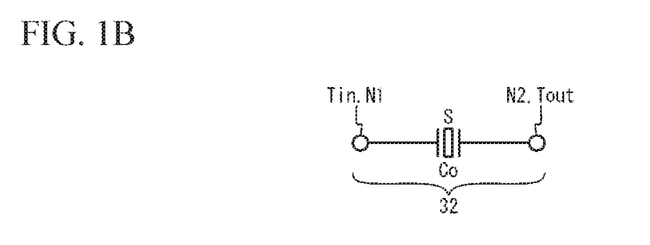
FIG. 1B and FIG. 1C illustrate a resonator in each section.
Figure 1C:
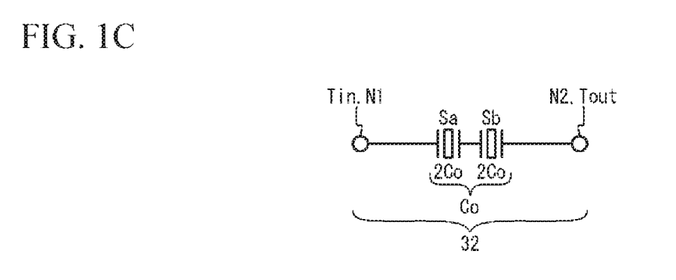

A description will be given of a ladder-type filter with use of a first comparative example. FIG. 1A is a circuit diagram of a ladder-type filter in accordance with a first comparative example, and FIG. 1B and FIG. 1C illustrate a resonator in each section. As illustrated in FIG. 1A, the ladder-type filter includes series resonators S1 through S4 and parallel resonators P1 through P3. The series resonators S1 through S4 are connected in series between an input terminal Tin and an output terminal Tout. The parallel resonators P1 through P3 are connected in parallel between the input terminal Tin and the output terminal Tout. Nodes at which the parallel resonators P1 through P3 are coupled to a series pathway 30 between the input terminal Tin and the output terminal Tout are referred to as nodes N1 through N3, respectively. The series pathway 30 includes sections 32 between the input terminal Tin and the node adjacent to the input terminal Tin, between the output terminal Tout and the node adjacent to the output terminal Tout, and the adjacent nodes of the nodes N1 through N3. The sections 32 are referred to as sections 32a, 32b, 32c, and 32d in this order from the input terminal Tin side. The both ends of the sections 32a through 32d are respectively the input terminal Tin and the node N1, the nodes N1 and N2, the nodes N2 and N3, and the node N3 and the output terminal Tout, and the nodes N1 through N3 are not included in the insides of the sections 32a through 32d.

High-frequency signals are input from the input terminal Tin, and signals in the passband are output from the output terminal Tout among the input high-frequency signals. Signals in other than the passband are suppressed among the input high-frequency signals.

As illustrated in FIG. 1B, when the series resonator S is not divided, the number of the series resonators S included in one section 32 is one. The capacitance of the series resonator S in this structure is assumed to be Co.

As illustrated in FIG. 1C, the series resonator included in one section 32 is divided into two series resonators Sa and Sb. At this time, when the capacitance Co of the section 32 differs from that of FIG. 1B, the characteristics, including the impedance, of the section 32 change. Thus, to remain the capacitance Co of the section 32 unchanged, each of the capacitances of the series resonators Sa and Sb is configured to be 2Co. This configuration makes the capacitance Co of the section 32 equal to that of FIG. 1B. The capacitances of the series resonators Sa and Sb may differ from each other. However, to make the capacitance of the section 32 equal to that of FIG. 1B, the capacitances of the series resonators Sa and Sb are greater than Co.

Figure 2A:
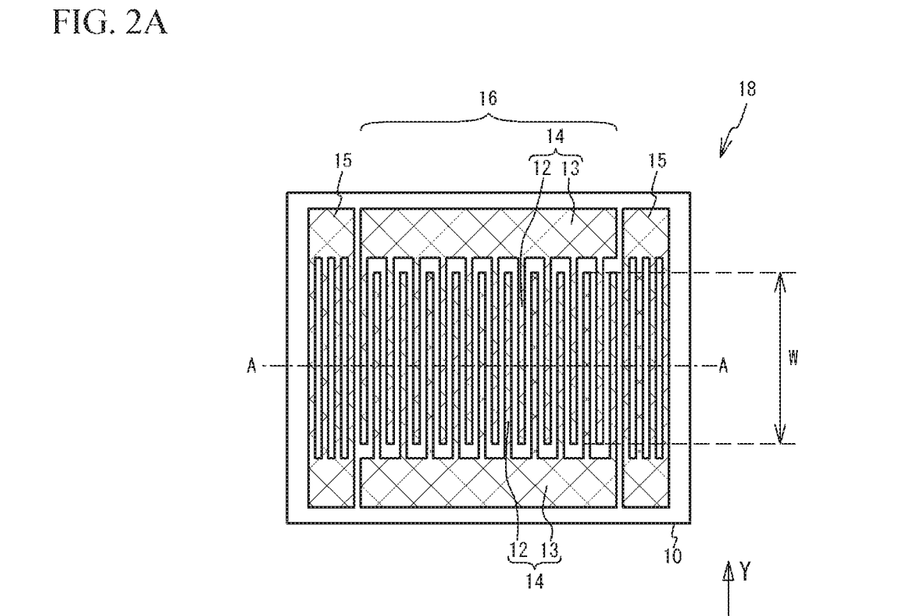
FIG. 2A is a plan view of an acoustic wave resonator.
Figure 2B:
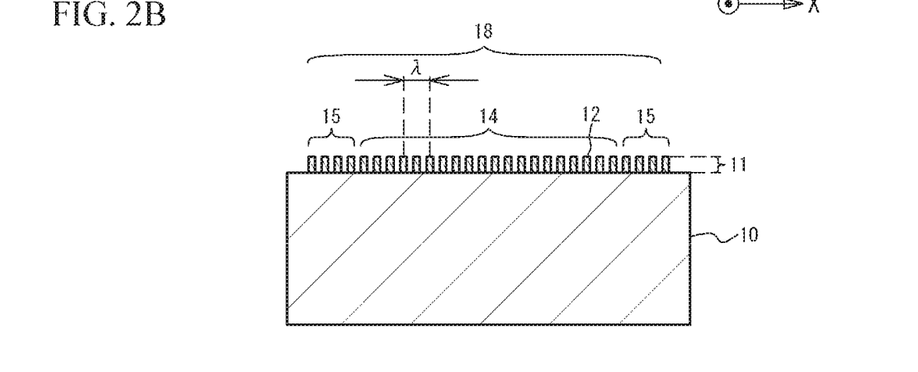
FIG. 2B is a cross-sectional view taken along line A-A in FIG. 2A.

A case where the series resonators S1 through S4 and the parallel resonators P1 through P3 are surface acoustic wave resonators will be described as an example. FIG. 2A is a plan view of an acoustic wave resonator, and FIG. 2B is a cross-sectional view taken along line A-A in FIG. 2A. As illustrated in FIG. 2A and FIG. 2B, in an acoustic wave resonator 18, an interdigital transducer (IDT) 16 and reflectors 15 are formed on a piezoelectric substrate 10. The IDT 16 and the reflectors 15 are formed of a metal film 11 formed on the piezoelectric substrate 10. The IDT 16 includes a pair of comb-shaped electrodes 14 facing each other. The comb-shaped electrode 14 includes a plurality of electrode fingers 12 and a bus bar 13 to which the electrode fingers 12 are coupled. The pair of comb-shaped electrodes 14 face each other so that the electrode fingers 12 of one of the comb-shaped electrodes 14 and the electrode fingers 12 of the other are alternately arranged.

The acoustic wave excited by the electrode fingers 12 mainly propagates in the arrangement direction of the electrode fingers 12. The propagating acoustic wave is reflected by the reflectors 15. The pitch of the electrode fingers 12 corresponds to the wavelength $\lambda$ of the acoustic wave. The propagation direction of the acoustic wave is defined as an X direction, and the direction perpendicular to the propagation direction (i.e., the extension direction of the electrode finger 12) is defined as a Y direction. The X direction and the Y direction do not necessarily correspond to the X-axis orientation and the Y-axis orientation of the crystal orientation of the piezoelectric substrate 10. In the Y direction, the length along which the electrode fingers 12 overlap is an aperture length W. When the piezoelectric substrate 10 is a rotated Y-cut X-propagation lithium tantalate substrate or a lithium niobate substrate, the X direction corresponds with the X-axis orientation of the crystal orientation. The piezoelectric substrate 10 may be bonded on an insulating substrate such as a sapphire substrate, a spinel substrate, or an alumina substrate, or a semiconductor substrate such as a silicon substrate. The metal film 11 is, for example, an aluminum film or a copper film. A protective film or a temperature compensation film covering the IDT 16 and the reflectors 15 may be provided.

To make each of the capacitances of the series resonators Sa and Sb in FIG. 1C twice the capacitance of the series resonator S in FIG. 1B, for example, the aperture length W in FIG. 2A is doubled. Alternatively, the number of pairs of the electrode fingers 12 is doubled. Thus, the total area of the series resonators Sa and Sb is more than twice the area of the series resonator S. On the other hand, since the aperture length W or the number of pairs increases in the series resonators Sa and Sb, the series resonators Sa and Sb are less likely to be damaged than the series resonator S even when large electric power is applied. As described above, the power durability is improved by dividing the series resonator S into Sa and Sb.

Second Comparative Example

Figure 3A:
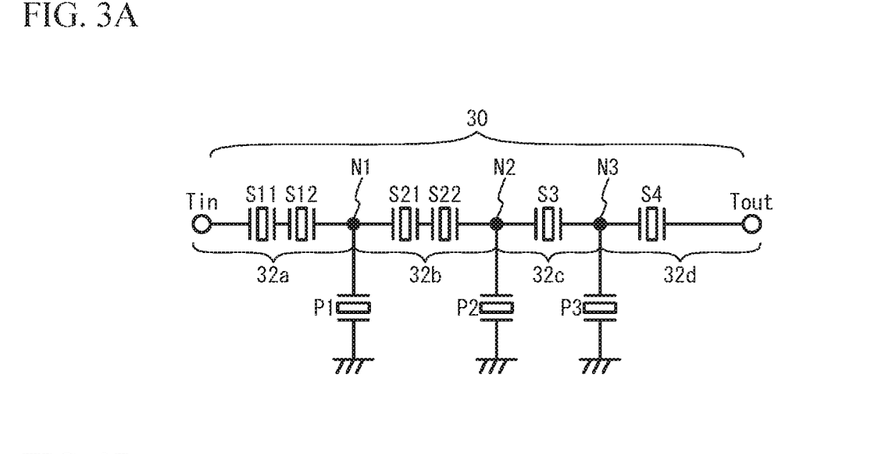
FIG. 3A is a circuit diagram of a filter in accordance with a second comparative example.
Figure 3B:
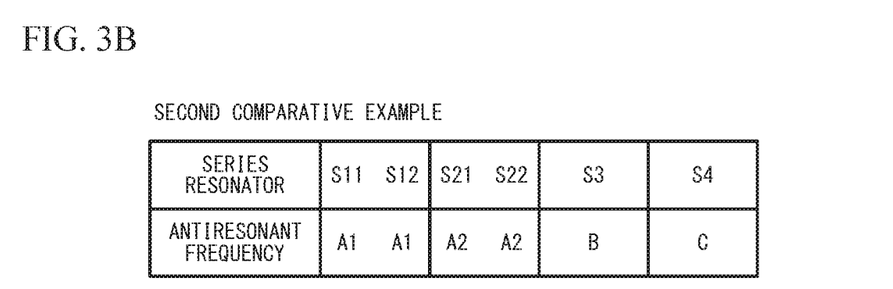
FIG. 3B illustrates the antiresonant frequencies of the series resonators.

A description will be given of a second comparative example that improves the power durability by dividing the series resonator. FIG. 3A is a circuit diagram of a filter in accordance with the second comparative example, and FIG. 3B illustrates the antiresonant frequencies of the series resonators. As illustrated in FIG. 3A, the second comparative example differs from the first comparative example in that the series resonator S1 is serially divided into series resonators S11 and S12. The series resonator S2 is serially divided into series resonators S21 and S22. That is, in the section 32a, the series resonators S11 and S12 are connected in series, and in the section 32b, the series resonators S21 and S22 are connected in series. As illustrated in FIG. 3B, the antiresonant frequencies of the series resonators S11 and S12 are A1, the antiresonant frequencies of the series resonators S21 and S22 are A2, and the antiresonant frequencies of the series resonators S3 and S4 are B and C, respectively. The section in which the series resonator is divided may be any of the sections 32a through 32d. Other structures are the same as those of the first comparative example, and the description thereof is thus omitted.

Figure 4:
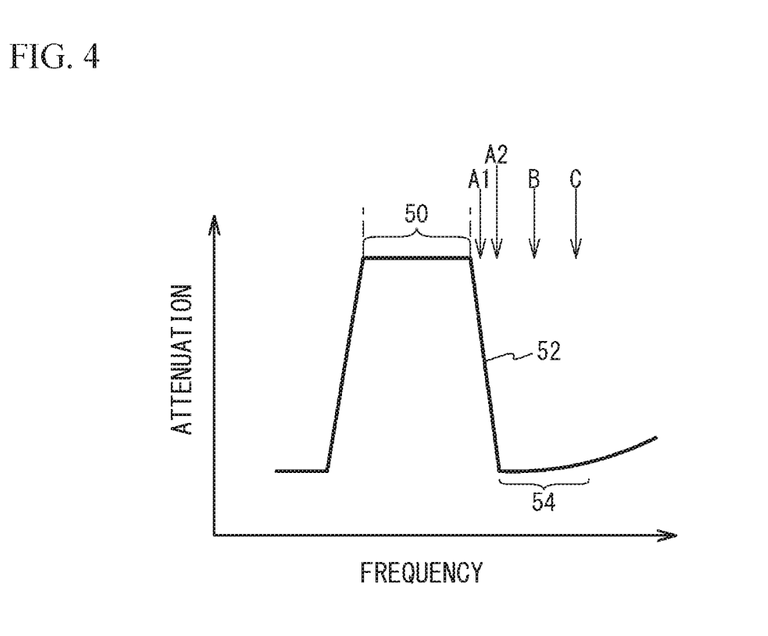
FIG. 4 illustrates the transmission characteristic of a ladder-type filter in a second comparative example.

FIG. 4 illustrates the transmission characteristic of the ladder-type filter in the second comparative example. As illustrated in FIG. 4, the transmission characteristic of the ladder-type filter is a bandpass filter characteristic having a passband 50. In the ladder-type filter, the antiresonant frequencies of the series resonators S1 through S4 form a skirt 52 and an attenuation range 54 at frequencies higher than the passband 50. Thus, the antiresonant frequencies of the series resonators S1 through S4 are configured so that the antiresonant frequencies A1 and A2 form the skirt 52 and the antiresonant frequencies B and C form the attenuation range 54. Since the antiresonant frequencies A1 and A2 form the skirt, the difference between A1 and A2 is small. The antiresonant frequencies B and C make the attenuation at frequencies away from the passband 50 large. Thus, the difference between A2 and B and the difference between A2 and C are greater than the difference between A1 and A2.

In the first comparative example, when a high-frequency signal with large electric power is input from the input terminal Tin, large electric power is applied to the series resonators S1 and S2 that form the skirt 52. Accordingly, the series resonators S1 and S2 to which large electric power is applied are damaged. Thus, the series resonators S1 and S2 easily applied with large electric power are respectively divided into the series resonators S11 and S12 and the series resonators S21 and S22 as in the second comparative example. This structure improves the power durability. Large electric power is not applied to the series resonators S3 and S4 that make the attenuation of the attenuation range 54 away from the passband 50 large. Thus, the series resonators S3 and S4 are not divided.

Third Comparative Example

Figure 5A:
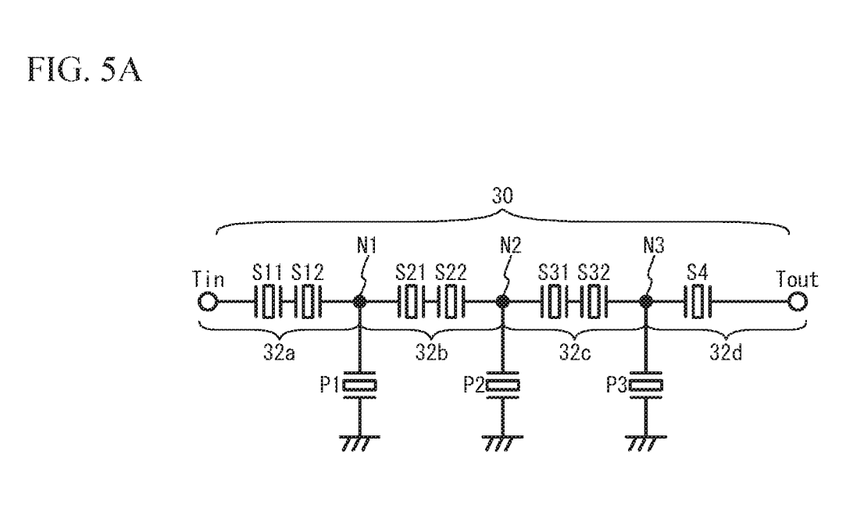
FIG. 5A is a circuit diagram of a filter in accordance with a third comparative example.
Figure 5B:
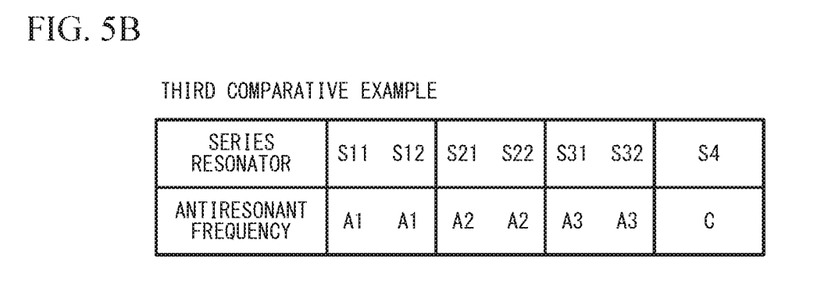
FIG. 5B illustrates the antiresonant frequencies of the series resonators.

FIG. 5A is a circuit diagram of a filter in accordance with a third comparative example, and FIG. 5B illustrates the antiresonant frequencies of the series resonators. As illustrated in FIG. 5A, in the third comparative example, a high-frequency signal with larger electric power than that in the second comparative example is input. Thus, the series resonator S3 is configured to be a resonator that forms the skirt 52, and the antiresonant frequency of the series resonator S3 is set at A3 close to A1 and A2. Furthermore, the series resonator S3 is divided into series resonators S31 and S32. This structure improves the power durability compared to that of the second comparative example.

In the second and third comparative examples, the power durability is improved by dividing the series resonators S1 through S3. However, since the divided series resonators form the resonant frequencies at the same frequency, the transmission characteristics in the second and third comparative examples are approximately the same as that in the first comparative example. Thus, when a series resonator with an antiresonant frequency different from those of the series resonators S1 through S3 is added to improve the attenuation characteristic of the attenuation range 54, the filter size increases. In addition, when the filter size is limited, the addition of an extra series resonator in addition to the division of the series resonators is difficult. Thus, it is desired to improve the attenuation characteristic while improving the power durability.

First Embodiment

Figure 6A:
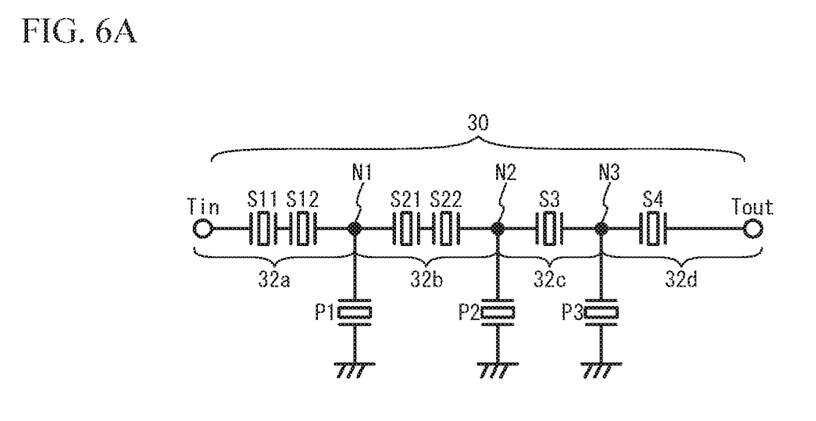
FIG. 6A is a circuit diagram of a filter in accordance with a first embodiment.
Figure 6B:
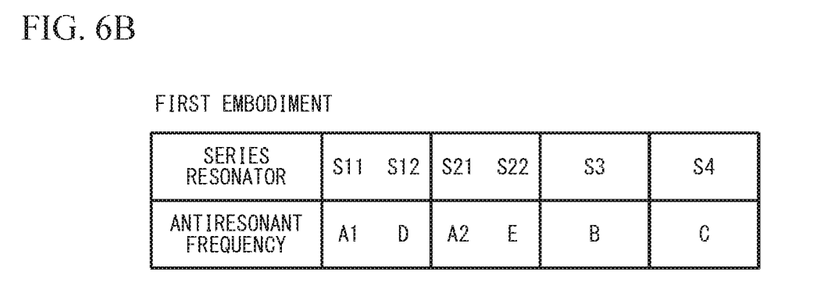
FIG. 6B and FIG. 6C illustrate the antiresonant frequencies of the series resonators of the first and second embodiments.
Figure 6C:
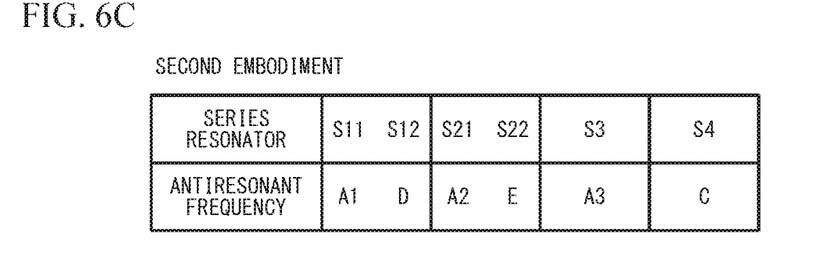

FIG. 6A is a circuit diagram of a filter in accordance with a first embodiment, and FIG. 6B and FIG. 6C illustrate the antiresonant frequencies of the series resonators of the first and second embodiments, respectively. As illustrated in FIG. 6A, the circuit diagram of the first embodiment is the same as that of the second comparative example, and the description thereof is thus omitted.

As illustrated in FIG. 6B, the antiresonant frequencies of the series resonators S11 and S21 are respectively configured to be A1 and A2 so as to form the skirt 52. The antiresonant frequencies of the series resonators S12 and S22 are respectively configured to be D and E so as to make the attenuation of the attenuation range 54 large.

The capacitances of the series resonators S11 and S21 are able to be greater than those of the series resonators S1 and S2 of the first comparative example. Thus, improved is the power durability of the series resonators S11 and S12 that form the skirt 52 and to which large electric power is applied. The antiresonant frequencies D and E of the series resonators S12 and S22 are configured so as to make the attenuation of the attenuation range 54 large. In the second comparative example, the number of antiresonant frequencies that form the attenuation range 54 is two: B and C. In contrast, in the first embodiment, the number of antiresonant frequencies that form the attenuation range 54 is increased to four: B through E. Thus, the attenuation characteristic of the attenuation range 54 is improved. As described above, the first embodiment improves the attenuation characteristic compared to the second comparative example while achieving the power durability approximately the same as that of the second comparative example.

Second Embodiment

As illustrated in FIG. 6C, the series resonator S3 is configured to have the antiresonant frequency A3 so as to form the skirt 52. Other structures are the same as those of the first embodiment. In the second embodiment, since the antiresonant frequency of the series resonator S3 is A3, the power durability is improved compared to that in the first embodiment. Thus, for example, when the power durability is not sufficient in the second comparative example, the power durability is improved without dividing the series resonator S3 unlike the third comparative example. Therefore, the increase in filter size is inhibited.

Third Embodiment

Figure 7:
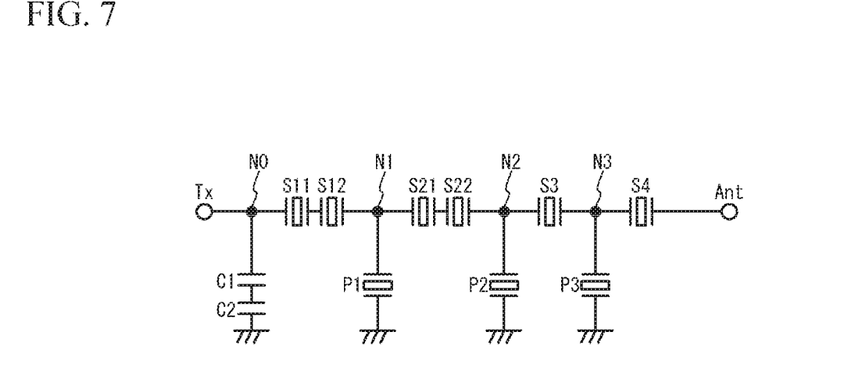
FIG. 7 is a circuit diagram of a filter in accordance with a third embodiment.

Simulated was a transmit filter for band 26 (transmit band: 814 to 849 MHz, receive band: 859 to 894 MHz) of Evolved Universal Terrestrial Radio Access (E-UTRA) Operating Band. FIG. 7 is a circuit diagram of a filter in accordance with a third embodiment. As illustrated in FIG. 7, capacitors C1 and C2 are connected in series between a node N0 between the input terminal Tin and the series resonator S11 and a ground. The capacitors C1 and C2 are provided to improve the isolation characteristic from the transmit terminal to the receive terminal in the receive band. Other structures are the same as those of the second comparative example and the first embodiment, and the description thereof is thus omitted.

Figure 8:
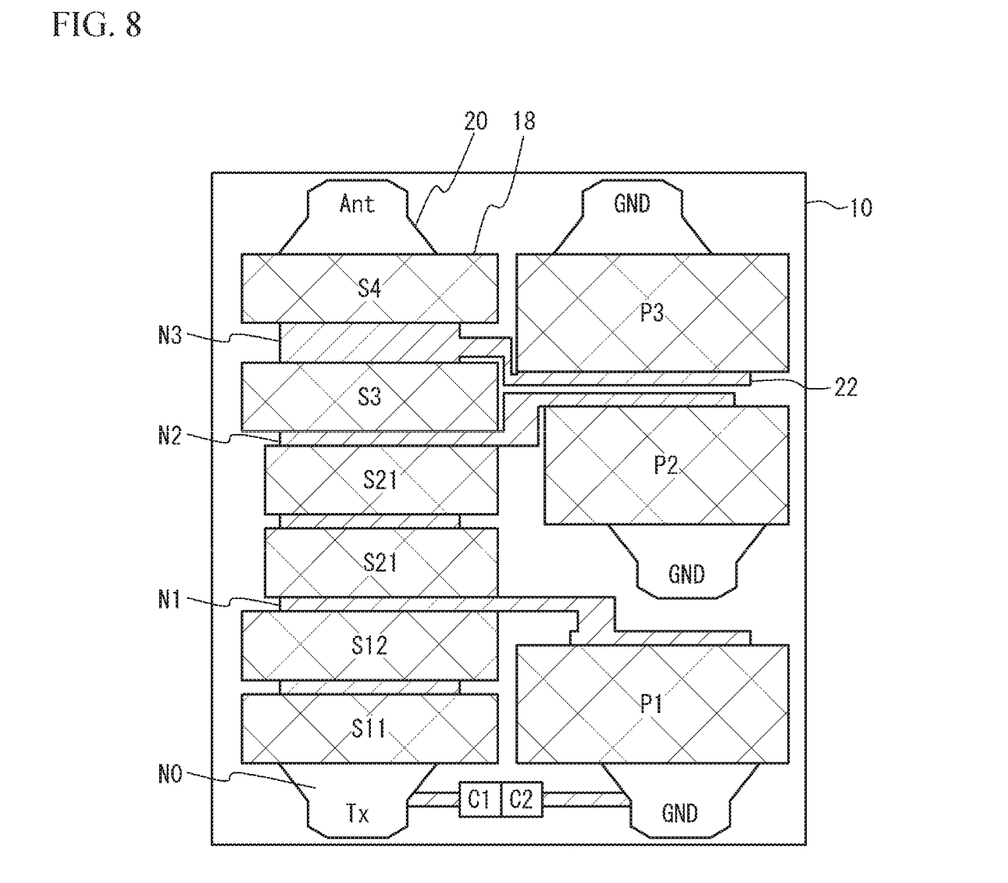
FIG. 8 is a plan view of the filter in accordance with a third embodiment.

FIG. 8 is a plan view of the filter in accordance with the third embodiment. As illustrated in FIG. 8, the series resonators S11 through S4 and the parallel resonators P1 through P3 are located on the piezoelectric substrate 10 as acoustic wave resonators 18. The piezoelectric substrate 10 is a 128° rotated Y-cut X-propagation lithium niobate substrate. The metal film 11 of the acoustic wave resonator 18 is a copper film with a film thickness of 0.06×λ. A silicon oxide film with a film thickness of 0.25×λ as a temperature compensation film is located on the piezoelectric substrate 10 so as to cover the electrode fingers 12. The capacitors C1 and C2 are located on the piezoelectric substrate 10. Each of the capacitors C1 and C2 is formed of a pair of comb-shaped electrodes facing each other. A transmit terminal Tx, a common terminal Ant, and ground terminals Gnd are located as pads 20 on the piezoelectric substrate 10. Wiring lines 22 formed on the piezoelectric substrate 10 connect between the acoustic wave resonators 18 and between the acoustic wave resonators 18 and the pads 20. The transmit terminal Tx corresponds to the node N0, the wiring line 22 between the series resonators S12 and S21 corresponds to the node N1, the wiring line 22 between the series resonators S21 and S3 corresponds to the node N2, and the wiring line 22 between the series resonators S3 and S4 corresponds to the node N3.

Figure 9A:
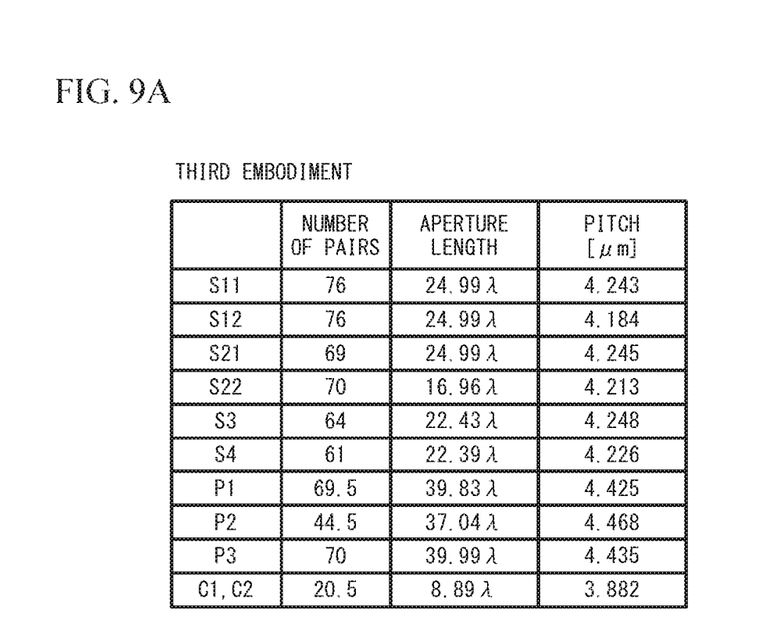
FIG. 9A and FIG. 9B illustrate the number of pairs, the aperture length, and the pitch λ of each resonator of the filters in accordance with the third embodiment and a fourth comparative example, respectively.
Figure 9B:
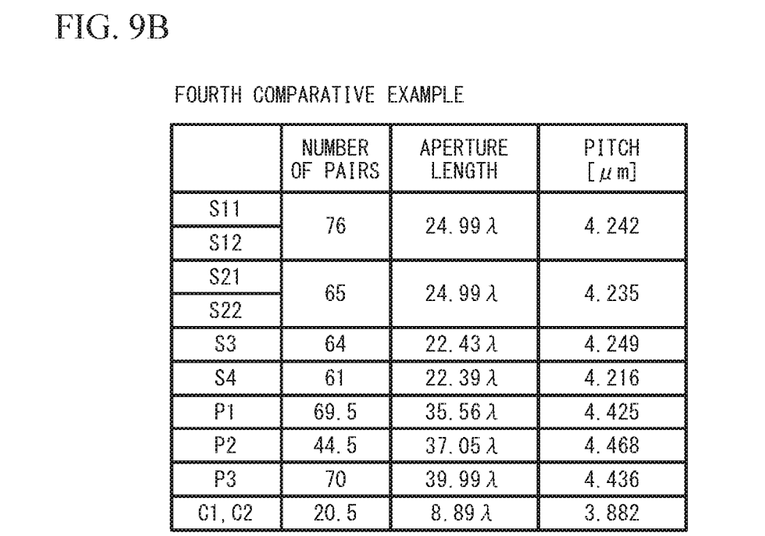

FIG. 9A and FIG. 9B illustrate the number of pairs, the aperture length, and the pitch λ of each resonator of the filters in accordance with the third embodiment and a fourth comparative example, respectively. The capacitors C1 and C2 are formed of a pair of comb-shaped electrodes. In the third embodiment, the pitch of the series resonator S11 differs from the pitch of the series resonator S12, and the pitch of the series resonator S21 differs from the pitch of the series resonator S22. The series resonators S11 and S21 have approximately the same pitch. This structure makes the series resonators S11 and S12 have different antiresonant frequencies, and the series resonators S21 and S22 have different antiresonant frequencies. The series resonators S11 and S21 have approximately the same antiresonant frequency. The pitches of the series resonators S12, S22, S3, and S4 in the third embodiment are optimized so that the attenuation range (the receive band) has good attenuation characteristics.

In the fourth comparative example, the number of pairs, the aperture length, and the pitch are the same between the series resonators S11 and S12. The number of pairs, the aperture length, and the pitch are the same between the series resonators S21 and S22. The pitches of the series resonators S3 and S4 in the fourth comparative example are optimized so that the attenuation range has good attenuation characteristics. Other configurations of the fourth comparative example are the same as those of the third embodiment.

Figure 10A:
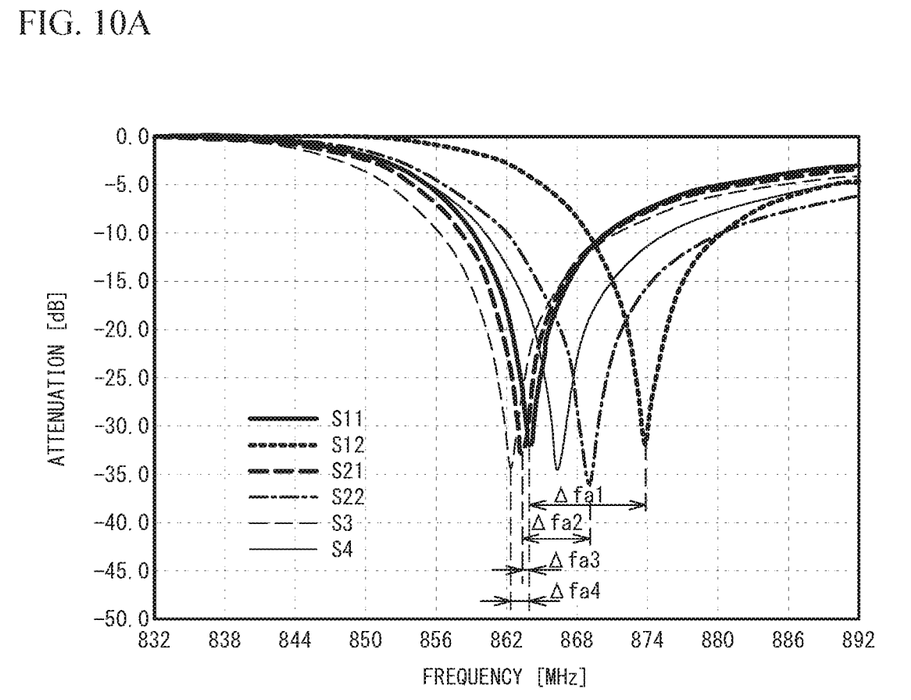
FIG. 10A illustrates the transmission characteristics of the series resonators in the third embodiment.
Figure 10B:
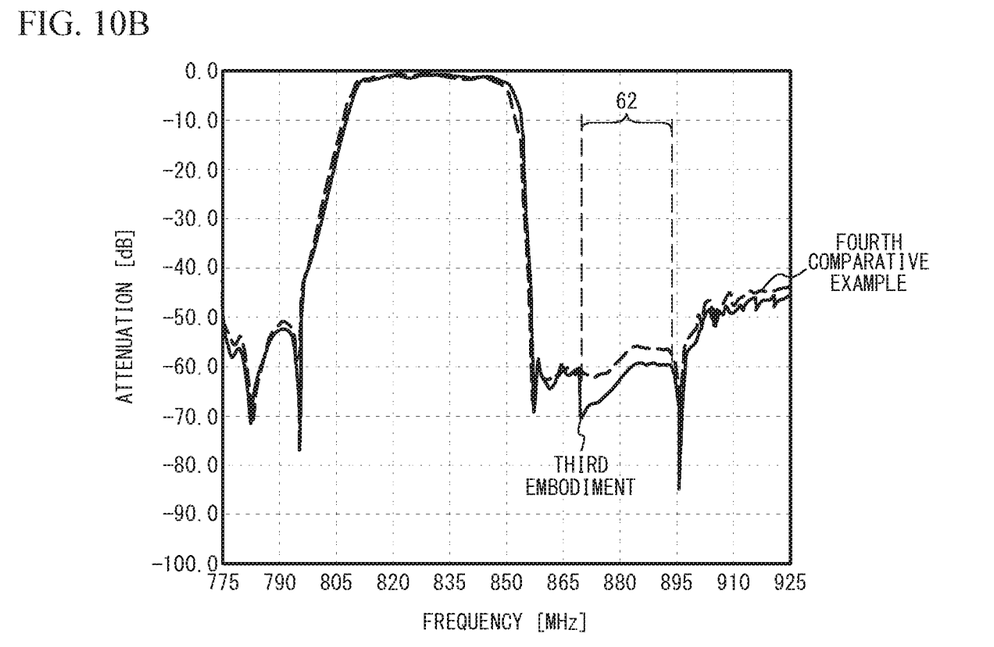
FIG. 10B illustrates the transmission characteristics of the third embodiment and the fourth comparative example.

FIG. 10A illustrates the transmission characteristics of the series resonators in the third embodiment, and FIG. 10B illustrates the transmission characteristics of the third embodiment and the fourth comparative example. As illustrated in FIG. 10A, in the third embodiment, the antiresonant frequencies of the series resonators S11, S21, and S3 that form the skirt are made to be close to each other. The antiresonant frequencies of the series resonators S12, S22, and S4 that form the attenuation range are configured to be away from the antiresonant frequencies of the series resonators S11, S12, and S3.

As illustrated in FIG. 10B, the third embodiment improves the attenuation characteristic in the receive band compared to the fourth comparative example. This is because the number of the series resonators for forming the attenuation range is three: S12, S22, and S4 in the third embodiment while the number of the series resonators for forming the attenuation range is two: S3 and S4 in the fourth comparative example.

Simulated was the maximum value of the power consumption per unit area in each of the chips of the third embodiment and the fourth comparative example. The area with high power consumption per unit area indicates that the electrical power concentrates. Thus, it is considered that the power durability is poor when the maximum value of the power consumption per unit area in the chip is large. The simulation results are as follows.

Third embodiment: 4.2 W/$\mu m^2$
Fourth comparative example: 6.0 W/$\mu m^2$

The above simulation results reveal that the third embodiment has better power durability than the fourth comparative example.

As described above, the number of series resonators are the same and the area is the same between the third embodiment and the fourth comparative example. However, the third embodiment improves the attenuation characteristic of the attenuation range and the power durability more than the fourth comparative example. Therefore, unlike the third comparative example, the desired power durability performance is secured without dividing the series resonator S3.

In the first through third embodiments, a difference in antiresonant frequency between the series resonators S11 (a first resonator) and S12 (a second resonator), which are connected in series in the section 32a (a first section), is represented by $\Delta fa1$ (a first difference). A difference in antiresonant frequency between the series resonators S21 (a third resonator) and S22 (a fourth resonator), which are connected in series in the section 32b (a second section), is represented by $\Delta fa2$ (a second difference). A difference in antiresonant frequency between the series resonators S11 and S21 is represented by $\Delta fa3$ (a third difference). In this case, as illustrated in FIG. 10A, $\Delta fa3$ is less than $\Delta fa1$ and $\Delta fa2$.

This configuration allows the electric power of the skirt to be distributed to the series resonators S11 and S21 with a large capacitance. Thus, the power durability is improved compared to that of the first comparative example. In addition, the series resonators S12 and S22 are able to form an attenuation pole in addition to the skirt. Thus, the number of attenuation poles is increased compared to those of the second through fourth comparative examples. Thus, the degree of freedom of design increases. The difference $\Delta fa3$ may be equal to or less than half of $\Delta fa1$ and $\Delta fa2$ or may be equal to or less than one-fifth of $\Delta fa1$ and $\Delta fa2$.

The antiresonant frequencies of the series resonators S12 and S22 are higher than the antiresonant frequencies of the series resonators S11 and S21. This configuration allows the attenuation range to be formed at frequencies higher than passband.

Only one series resonator S3 (a fifth resonator) is connected in the section 32c (a third section). The filter size is reduced by providing the section in which the series resonator is not divided.

As illustrated in FIG. 10A, the largest difference of the differences in antiresonant frequency between the series resonator S3 and the series resonators S11 and S21 is represented by $\Delta fa4$. The difference $\Delta fa4$ is less than $\Delta fa1$ and $\Delta fa2$. This configuration allows the electric power of the skirt to be distributed to the series resonators S11, S21, and S3, thus improving the power durability. The series resonator S3 may be a resonator forming the attenuation range.

In the first through third embodiments, the section in which the series resonator is divided may be any of the sections 32a through 32d. Large electric power is easily applied to a section close to the input terminal Tin. Thus, one section 32a of the sections in which the series resonator is divided is preferably the section closest to the input terminal Tin. Furthermore, another one section 32b of the sections in which the series resonator is divided is preferably the section second closest to the input terminal Tin. This configuration further improves the power durability.

Only one series resonator S4 (a sixth resonator) is connected in the section 32d (a fourth section). As described above, when there are a plurality of sections 32c and 32d in which only one series resonator is connected, the section 32c including the series resonator S3 that forms the skirt is the section third closest to the input terminal Tin. This configuration further improves the power durability.

The antiresonant frequencies of the series resonators S12 and S22 may be close to each other and form the skirt. Since the series resonators S11 and S21 are located closer to the input terminal, the antiresonant frequencies of the series resonators S11 and S21 are preferably close to each other.

The first through third embodiments describe a case where the number of sections is four as an example. However, it is only required that the number of sections is two or more. A case where the number of sections in which series resonator is divided is two is described, but the number of sections in which the series resonator is divided may be three or more. A case where the series resonator is divided into two in each of the sections 32a and 32b is described, but the series resonator may be divided into three or more.

A case where the series resonators S11 through S4 and the parallel resonators P1 through P3 are surface acoustic wave resonators, but the series resonators S11 through S4 and the parallel resonators P1 through P3 may be piezoelectric thin film resonators.

Fourth Embodiment

Figure 11:
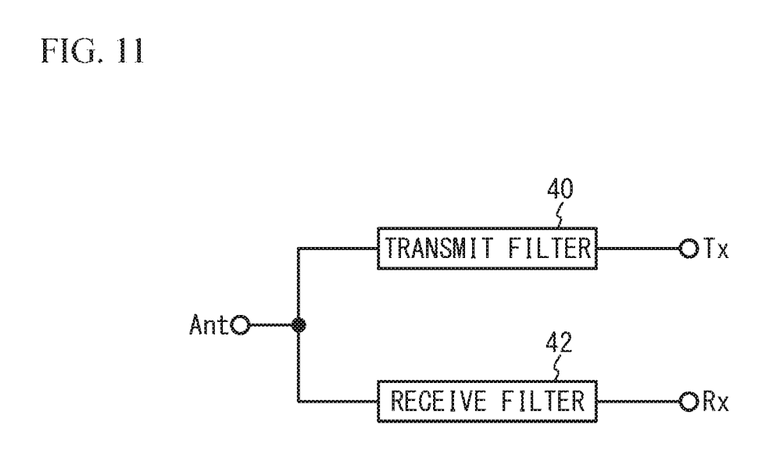
FIG. 11 is a circuit diagram of a duplexer in accordance with a fourth embodiment.

A fourth embodiment is an exemplary multiplexer. FIG. 11 is a circuit diagram of a duplexer in accordance with a fourth embodiment. As illustrated in FIG. 11, a transmit filter 40 (a first filter) is connected between the common terminal Ant and the transmit terminal Tx (a first terminal). A receive filter 42 (a second filter) is connected between the common terminal Ant and a receive terminal Rx (a second terminal). The transmit filter 40 transmits signals in the transmit band to the common terminal Ant among high-frequency signals input to the transmit terminal Tx, and suppresses other signals. The receive filter 42 allows signals in the receive band to pass therethrough among high-frequency signals input to the common terminal Ant, and suppresses other signals.

When the receive band is higher than the transmit band, the filter according to any one of the first through third embodiments is used for the transmit filter. This configuration improves the attenuation characteristic in the receive band.

The duplexer is described as an example of the multiplexer, but the multiplexer may be a triplexer or a quadplexer. A case where the first filter is a transmit filter and the second filter is a receive filter is described, but the first filter may be a receive filter and the second filter may be a transmit filter. Both the first filter and the second filter may be transmit filters or receive filters.

Although the embodiments of the present invention have been described in detail, it is to be understood that the various change, substitutions, and alterations could be made hereto without departing from the spirit and scope of the invention.

What is claimed is:

1. A filter comprising:
    a plurality of parallel resonators connected in parallel between an input terminal and an output terminal;
    a plurality of series resonators connected in series between the input terminal and the output terminal;
    a plurality of nodes at which the plurality of parallel resonators are coupled to a series pathway between the input terminal and the output terminal;
    a first resonator and a second resonator included in the plurality of series resonators and connected in series in a first section of a plurality of sections, an absolute value of a difference in antiresonant frequency between the first resonator and the second resonator being a first difference, each of the plurality of sections being the series pathway between adjacent nodes of the plurality of nodes, the series pathway between the input terminal and a node, of the plurality of nodes, adjacent to the input terminal, or the series pathway between the output terminal and a node, of the plurality of nodes, adjacent to the output terminal; and
    a third resonator and a fourth resonator included in the plurality of series resonators and connected in series in a second section of the plurality of sections, an absolute value of a difference in antiresonant frequency between the third resonator and the fourth resonator being a second difference, a third difference that is an absolute value of a difference in antiresonant frequency between the first resonator and the third resonator being less than the first difference and the second difference,
    wherein
    the second resonator and the fourth resonator have antiresonant frequencies greater than antiresonant frequencies of the first resonator and the third resonator,
    the first section is a section closest to the input terminal among the plurality of sections, and
    both of an antiresonant frequency of the first resonator and an antiresonant frequency of the third resonator are higher than a skirt of a transmission characteristic of the filter, and both of an antiresonant frequency of the second resonator and an antiresonant frequency of the fourth resonator are higher than both of the antiresonant frequency of the first resonator and the antiresonant frequency of the third resonator.

2. The filter according to claim 1, further comprising a single fifth resonator included in the plurality of series resonators and connected in a third section of the plurality of sections,
    wherein any resonators other than the single fifth resonator are not connected in the third section.

3. The filter according to claim 2, wherein
    a fourth difference that is an absolute value of a difference in antiresonant frequency between the fifth resonator and the first resonator and the third resonator is less than the first difference and the second difference, and an antiresonant frequency of the fifth resonator is higher than the skirt and both of the antiresonant frequency of the second resonator and the antiresonant frequency of the fourth resonator is higher than the antiresonant frequency of the fifth resonator.

4. The filter according to claim 3, further comprising a single sixth resonator included in the plurality of series resonators and connected in a fourth section of the plurality of sections, wherein
    the second section is a section second closest to the input terminal among the plurality of sections, and
    the third section is a section third closest to the input terminal among the plurality of sections.

5. The filter according to claim 1, wherein
    the second section is a section second closest to the input terminal among the plurality of sections.

6. The filter according to according to claim 1, wherein each of the plurality of series resonators is an acoustic wave resonator.

7. The filter according to claim 1, wherein
    the third difference is less than half of the first difference and the second difference.

8. The filter according to claim 1, wherein
    the third difference is less than one-fifth of the first difference and the second difference.

9. The filter according to claim 1, wherein
    the first resonator is closer to the input terminal than the second resonator, and
    the third resonator is closer to the input terminal than the fourth resonator.

10. The filter according to claim 1, wherein
    both of the first resonator and the third resonator form the skirt and both of the second resonator and the fourth resonator form an attenuation range of the filter.

11. A multiplexer comprising:
    a filter including:
        a plurality of parallel resonators connected in parallel between an input terminal and an output terminal;
        a plurality of series resonators connected in series between the input terminal and the output terminal;
        a plurality of nodes at which the plurality of parallel resonators are coupled to a series pathway between the input terminal and the output terminal;
        a first resonator and a second resonator included in the plurality of series resonators and connected in series in a first section of a plurality of sections, an absolute value of a difference in antiresonant frequency between the first resonator and the second resonator being a first difference, each of the plurality of sections being the series pathway between adjacent nodes of the plurality of nodes, the series pathway between the input terminal and a node, of the plurality of nodes, adjacent to the input terminal, or the series pathway between the output terminal and a node, of the plurality of nodes, adjacent to the output terminal; and a third resonator and a fourth resonator included in the plurality of series resonators and connected in series in a second section of the plurality of sections, an absolute value of a difference in antiresonant frequency between the third resonator and the fourth resonator being a second difference, a third difference that is an absolute value of a difference in antiresonant frequency between the first resonator and the third resonator being less than the first difference and the second difference, wherein the second resonator and the fourth resonator have antiresonant frequencies greater than antiresonant frequencies of the first resonator and the third resonator, the first section is a section closest to the input terminal among the plurality of sections, and both of an antiresonant frequency of the first resonator and an antiresonant frequency of the third resonator are higher than a skirt of a transmission characteristic of the filter, and both of an antiresonant frequency of the second resonator and an antiresonant frequency of the fourth resonator are higher than both of the antiresonant frequency of the first resonator and the antiresonant frequency of the third resonator.

12. A multiplexer comprising:

a first filter connected between a common terminal and a first terminal, the first filter being a filter including:

a plurality of parallel resonators connected in parallel between an input terminal and an output terminal;

a plurality of series resonators connected in series between the input terminal and the output terminal;

a plurality of nodes at which the plurality of parallel resonators are coupled to a series pathway between the input terminal and the output terminal;

a first resonator and a second resonator included in the plurality of series resonators and connected in series in a first section of a plurality of sections, an absolute value of a difference in antiresonant frequency between the first resonator and the second resonator being a first difference, each of the plurality of sections being the series pathway between adjacent nodes of the plurality of nodes, the series pathway between the input terminal and a node, of the plurality of nodes, adjacent to the input terminal, or the series pathway between the output terminal and a node, of the plurality of nodes, adjacent to the output terminal; and a third resonator and a fourth resonator included in the plurality of series resonators and connected in series in a second section of the plurality of sections, an absolute value of a difference in antiresonant frequency between the third resonator and the fourth resonator being a second difference, a third difference that is an absolute value of a difference in antiresonant frequency between the first resonator and the third resonator being less than the first difference and the second difference; and a second filter connected between the common terminal and a second terminal and having a passband higher than a passband of the first filter, wherein the second resonator and the fourth resonator have antiresonant frequencies greater than antiresonant frequencies of the first resonator and the third resonator, the first section is a section closest to the input terminal among the plurality of sections, and both of an antiresonant frequency of the first resonator and an antiresonant frequency of the third resonator are higher than a skirt of a transmission characteristic of the filter, and both of an antiresonant frequency of the second resonator and an antiresonant frequency of the fourth resonator are higher than both of the antiresonant frequency of the first resonator and the antiresonant frequency of the third resonator.

* * * * *